United States Patent [19]
Levi et al.

[11] Patent Number: 5,148,504
[45] Date of Patent: Sep. 15, 1992

[54] OPTICAL INTEGRATED CIRCUIT DESIGNED TO OPERATE BY USE OF PHOTONS

[75] Inventors: Anthony F. J. Levi, Summit; Samuel L. McCall, Chatham; Richart E. Slusher, Lebanon, all of N.J.

[73] Assignee: AT&T Bell Laboratories, Murray Hill, N.J.

[21] Appl. No.: 777,888

[22] Filed: Oct. 16, 1991

[51] Int. Cl.⁵ .............................................. G02B 6/12
[52] U.S. Cl. ..................................................... 385/14
[58] Field of Search .......................... 385/14, 27, 31; 357/30 G Primary Examiner—John D. Lee
Assistant Examiner—Phan T. Heartney
Attorney, Agent, or Firm—G. S. Indig

[57] ABSTRACT

Optical integrated circuitry, performing various of the functions associated with electronic integrated circuitry, is disclosed. Fabrication, importantly to achieve high circuit chip density—typically in the range of $10^6$ as including both devices and interconnecting guides—is dependent upon device/spacing dimension miniaturization resulting from fabrication in very thin layers. Typical layer thickness as retained in fabricated devices and guides, of a maximum of the order of a ½ wavelength for relevant photon flux, results in limitation in cross-talk to permit device design rules of one or a few wavelengths.

22 Claims, 5 Drawing Sheets

OPTICAL INTEGRATED CIRCUIT DESIGNED TO OPERATE BY USE OF PHOTONS

BACKGROUND OF THE INVENTION

1. Technical Field

Optical circuitry, as included in all-optical as well as electro-optical integrated circuits, is characterized by high population density as well as efficient operation of optical elements-active and/or passive.

2. Description of the Prior Art

Dominance of optical transmission for use in most high capacity long distance systems is now well established. Concentrated effort both here and abroad has resulted in expedient manufacture, installation, and use of fiber which satisfies the motivating promise of high capacity, low loss transmission. While not as well developed, the status of medium and short distance is not very different. Active backplane as well as microstrip media are on their way to satisfying needs.

For the most part advances in optical transmission have not been matched in interfacing circuitry. Most operating systems rely on electronics for interfacing with optical transmission. Modulation of the optical carrier, generation of optical signals to be inserted in the transmission line, detection of such signals at line terminals, amplification at repeater stations, etc. all depend upon electronics rather than photonics. Equipment expense as well as operating problems at electronic-optical interfaces have provoked worldwide effort toward development of all-optical equipment.

While interfacing with optical transmission system is properly regarded as the chief motivation, at least on the shorter term, inherent properties of optics provoke effort directed toward optical circuitry. The ultimate ambition is all-optical in terms of device function. At this time, and probably for some time in the future, convenience of electronic biasing/pumping suggests that circuitry will take the form of opto-electronic integrated circuits. The likelihood that electronic elements will continue to be of choice for some functions supports this conclusion.

Circuit density has been a major concern in the development of optical ICs—as regards both transmission paths and devices, e.g. amplifiers, switches, etc. Unwanted evanescent field coupling—a phenomenon of little consequence in electronics—imposes spacing limitations as between adjacent paths and devices. Effort directed toward optical IC chips to perform all but the simplest functions has been thwarted by crosstalk and other consequences of unwanted coupling. Lessening of such effects has led to spacings generally of tens of micrometers—generally to tens of wavelengths as measured in vacuum. (The two spacing measures are quite similar for popular operating wavelengths from $\approx 0.9$ to $1.55$ $\mu m$ as available from popular GaAs and InP-based devices.) Use of design rules of $\approx 10$ $\mu m$ would satisfy some short term conservative objectives, but even at that level, unwanted coupling, likely above $\approx 10\%$, is objectionable both in terms of noise and of energy/heat dissipation.

SUMMARY OF THE INVENTION

In general terms the invention permits expedient incorporation of optics into ICs. Such integrated circuits may be all-optical or electro-optic but invariably share close spacing and small size to permit high device density for a permitted level of unwanted coupling. The most consequential effect of unwanted coupling is in terms of Crosstalk—unwanted signal or "noise" as input into a circuit element responsible for carrying signal information. The invention permits spacing/size as to accommodate generally imposed noise restrictions. Most important embodiments, in terms of either electro-optic or all-optic, are full functioning in the sense that device interconnections are optic as are the devices themselves. Devices, which may serve the various functions of, e.g. signal transport, amplification, and temporal as well as spatial switching, are, to substantial extent, interconnected without electronic interface in the signal circuitry. Electronics, to the extent involved, likely serves "support functions" such as biasing—either constant or intentionally varying—or energizing—e.g. for laser pumping.

The essence has been stated—device size/spacing with lesser coupling to permit "full functioning" IC optics. In representative terms unwanted coupling—e.g. as resulting in crosstalk—may be maintained at a level of $\leq 10\%$ consistent with spacings of $\approx 10$ $\mu m$, or $\approx 5\lambda_0$ for emission wavelengths conveniently available from III-V semiconductor lasers.

Relevant optical IC portions whether constituting part or the entirety of the total IC, are, most importantly, characterized by a functional layer thickness dimension (the dimension orthogonal to the plane of the IC) of a maximum of a half wavelength or preferably of a quarter wavelength for relevant propagating photonic energy, with this dimension, in turn, being maintained physically thin by virtue of choice of materials to result in high-optical contrast in salient direction/s. Low coupling, high device density of the invention is made possible by index contrast at bounding device interfaces—ratio of refractive index values within and outside relevant devices—numerically 1.5 or preferably higher. Permitted layer thickness and other critical dimensions are discussed in the Detailed Description for usual operation. For generally contemplated wavelengths the device-functional layer thickness is within the broad range of from 500 Å to a few thousand Å—typically from 1,000 Å to 2,000 Å. Guide strength resulting from such specification permits not only a spacing, device-to-device spacing, of approx $10\lambda_0$ or less—even of approx $5\lambda_0$—while meeting noise requirements. In addition, reducing the energy fraction and field penetration depth into the surround, permits shorter radius of curvature, thereby again adding to design flexibility to permit greater device density, commensurate with given coupling crosstalk/loss.

It is an attribute of the invention that the device-functional layer may be of proper composition and dimension to serve for fabrication of devices of differing functionally—active as well as passive. Briefly, contemplated devices may make use of such a layer, in turn, constructed of sublayers. Such a "superlayer", in totality of the thickness specified above, may be made up of sublayers each constituting a quantum well (as separated by barrier layers) e.g. in a laser structure. The same superlayer, with or without modification, lends itself to—may even enhance—other operating structures. The term, "superlayer" is intended to include superlattice layers as well as Multiple Quantum Wells. Superlattice structures, while similar, differ in known respects to better adapt them to particular devices. While detailed description is not necessary here, a difference entails freedom of carrier motion—while carriers are generally constrained to a particular QW of an MQW structure, carriers are not so constrained in a superlattice.

Examples set forth include: guides which, themselves, may serve as active elements to couple or to decouple in accordance with a variety of controls; controls depending on applied electric field or photons, e.g. to Q-spoil cavity characteristics relative to associated elements or to saturate and thereby "bleach" a device material (as defined herein to include guide material) in this instance operating as a saturable absorber. Other examples include modification of refractive index responsive to injected carriers e.g. to alter resonance frequency. Many other control mechanisms are known and are contemplated.

BRIEF DESCRIPTION OF THE DRAWING

FIGS. 1-9 illustrate representative structures usefully incorporated in full functioning optical circuitry in accordance with the inventive teaching.

In general, discussion is in terms of specific noted attributes. Characteristics of devices meeting the inventive criteria permit design flexibility in more general terms. For example, device dimensions—both orthogonal to and in plane—and the high energy confinement fundamental to the inventive teaching—are generally advantageous. The problem of "skew"—e.g. differing arrival times of signals or signal portions to be simultaneously processed—is addressable by sizing and/or shaping signal elements so as to delay or advance—so as to assure simultaneous arrival. Variation in effective refractive index due to signal-to-surface/interface represents one approach for accomplishment. Path length increase by guide bending, as discussed with reference to FIG. 1, represents another approach.

FIG. 8 is a cross sectional view of a structure providing for coupling—evanescent field coupling—of adjacent elements as enhanced by element-to-element bridging as discussed further on;

FIG. 11, consisting of six cross-sectional views.

DETAILED DESCRIPTION

Definition of Terms

To a significant extent, terminology used in the description of this invention is that used in the telecommunications industry. It is clear that the inventive teaching is applicable to a broader range of technologies—including other forms of communication, private as well as public, computer, television, etc. Some of these are discussed by use of specialized terminology. The particular terminology chosen in this description is, accordingly, not to be regarded as limiting.

Signal—information, e.g. as inputted to a concerned optical IC portion in the course of device operation. Generally encoded, it may include processing instructions—the latter often referred to as "header". The remainder of the signal, or the entirety if no header is included, is sometimes referred to as a "data stream".

Control Signal—information designed to modify signal with regard, e.g. to path choice, path direction, amplitude, etc. as well as to change intelligence content of the signal. Control signal information may be introduced together with the data stream in the form of a "header" as noted in the preceding paragraph. Alternatively, or in addition, control signal information may be introduced separately, into one or more elements within the body of the concerned IC portion. Control signals may take any appropriate energy form—likely electrical or optical.

Crosstalk—as rigorously defined, the term refers to signal information as improperly input e.g. into an active device or passive device—by virtue of unwanted coupling. Meaningful design criteria importantly concern the extent to which such "noise" can be tolerated—a level which for many purposes is at the $\leq 10\%$ or preferably 5% level (see Detailed Description for further details).

The term "crosstalk" is often used in a less rigorous sense—in terms of energy loss by the device yielding the crosstalk. This has consequence in terms of possible need for amplification/regeneration. In terms of unwanted coupling with apparatus not carrying signal information—e.g. as generally true of the substrate, "crosstalk" has implications solely in terms of energy loss.

Full Functioning Circuit—refers to circuitry, circuit regions, circuit portions in which signal processing is of a variety of forms. The terminology as applied to optical IC portions is intended to include at least three of the functions of: transport, redirection, combination, splitting, modulation, and amplification. It is generic both to optical and electronic circuitry, as well as to optoelectronic circuitry.

Full Functioning Optical Circuit—As above, but refers to such circuit in which at least 95% of forms of signal processing contemplated is by means of active optical elements, i.e. elements of optical properties varied by control signals. As otherwise noted, transport as between optical devices in such circuit is usually—essentially invariably—itself optical.

Signal Circuitry—refers to that part of a functioning circuit, e.g. of a functioning optical circuit, accomplishing functions noted, e.g. redirection, combination, splitting (or fan-out), modulation, amplification and transport of signal being input. The term is intended to be independent of "support circuitry".

Support Circuitry—refers to circuitry responsible for operating the signal circuitry—e.g. as control with regard to active elements—responsible for signal processing. Functions of support circuitry include biasing and energizing, e.g. pumping of an included laser or Light Emitting Diode.

Full Functioning Optical Integrated Circuit or Full Functioning Optical IC—reference is made to the full functioning optical circuit or circuit portion which is the primary objective of the inventive teaching. Depending on context such IC may be all-optic, or may include electronic circuitry/elements as to cause or facilitate optical operation, e.g. designed to electronically pump or bias associated optical circuitry.

Device-Functional Layer—this refers to a material layer from which devices are fabricated within which concerned optical energy is largely confined. This layer is initially deposited on a supporting surface—either that of the primary substrate or of some intermediate layer in turn supported by such substrate. In some instances device construction does not require retention of such supporting surface so that fabrication may entail removal to leave an exposed device-functional layer. Contemplated fabrication variations may include backfilling as by deposition to cover part or the entirety of the exposed layer, likely with material presenting significantly lowered refractive index than that of the layer. Much of the description is in terms of a preferred embodiment which depends on a single such layer for most or even all optical elements within the full functioning optical IC. Variations may depend on more than a single layer.

Passive Element or Passive Device—an element for inclusion in an optical IC in which any change in photon flux—e.g. splitting, merging—is due to unchanging characteristics of the element-perhaps solely by virtue of the character of the element; perhaps as affected by ancillary biasing or other means. The prime example is the simple element-to-element optical guide—e.g. as connecting two active elements. Any changing characteristic may be regarded as "noise"—is unnecessary to the IC function. Change such as due to effect of varying temperature is necessarily within device tolerance limits.

Active Element or Active Device—an element affording means for changing some characteristic for relevant photon flux during IC operation. The term includes both elements designed to generate/amplify photonic energy—lasers—as well as those performing other IC functions such as: modulating; coupling—decoupling; splitting/combining; switching, etc.

"n"—is the refractive index for the particular wavelength of photon flux concerned—as related to that in vacuum. Consistent with general usage the term has reference to the bulk value of refractive index—i.e. the refractive index for such wavelength as measured in a body of uniform composition and of infinite size (to avoid alteration of value due to flux-surface interaction).

"$n_D$"—is the average value of bulk refractive index for the device-functional layer. In instances in which the device-functional layer is of varying index, e.g. as in a "superlayer" (constituted of sublayers of differing refractive index), the term represents an "average"—i.e. the index "seen" (the index value explanatory of observed action) by photon flux traveling in a given direction within a body of index $n_D$, in which index value is unaffected by interaction with bounding surface/interface.

"$n_S$"—is the bulk refractive index for the material/environment bounding the device-functional layer. As in the definition of $n_D$, the term may represent a weighted average in the instance of local variation in index.

$\lambda$—wavelength of concerned photon flux, generally expressed as such value in vacuum, $\lambda_0$.

$\lambda_0$—wavelength of concerned photon flux as measured in vacuum.

Index Contrast—ratio of refractive index values as between the device-functional layer and surrounding material in terms of the ratio $n_D/n_S$, in which $n_D$ and $n_S$ are as defined above.

General

The inventive impact has been discussed in the Summary. Advantages implicit in use of photons rather than electrons have provoked prior effort as well as the work resulting in the present invention. One such advantage concerns the fact that photons, unlike electrons, are uncharged. This fact gives rise to circuit approaches that may be of value. As an example, integrity of photon flux direction is unaffected by proximity and even by crossing—by local usage of the same functional device region simultaneously by two defined flows.

The inventive teaching overcomes what is perceived as the main obstacle to realization of such advantages as well as to more general use of integrated optics. The invention addresses difficulty concerned with an implicit difference as between photonics and electronics. For dimensions contemplated—for micron device dimensions—miniaturization of electronic Integrated Circuits is not, in principle, complicated by unwanted coupling due to imperfect guiding. In simple terms, dielectric contrast as between electronic conductor and insulator is very large compared to the available index contrast for photons. Device dimension and device spacing attained in electronic ICs at both present and now-contemplated design rules have primarily concerned fabrication. Design rules have decreased apace with: e.g. improved lithographic definition as afforded by decreased wavelength of delineating radiation; and a variety of practical problems concerning image registration, etch removal, controlled diffusion, etc.

Miniaturization of photonic circuitry is complicated by significant field penetration through the interface between device and surround—in simple transmission lines (generally, in passive devices as well as in the whole variety of active devices. This consideration, one with little analogy in electronics at present dimensions, results in the whole variety of unwanted coupling effects—including crosstalk as well as other forms of noise, and energy loss. The latter is a further problem due to absorption accompanying heating.

The major thrust of the invention depends upon the very significant increase in guiding strength for optical signals which is a consequence of two contributions both relating to the nature of the layered material from which elements are fabricated. The first of these requires a layer thickness, T, of a maximum of "$\frac{1}{2}\lambda$" in accordance with the equation:

$$T \leq \frac{\lambda_0}{2\sqrt{n_D^2 - n_S^2}}$$

This maximum permitted layer thickness substantially assures single mode operation—to lessen crosstalk/loss likely larger for higher order modes, and to lessen mode dispersion which might otherwise limit operating frequency. While some mode conversion will occur, its likelihood is reduced by limiting functional layer thickness to this "$\frac{1}{2}\lambda$" value or less.

For many purposes a preferable layer thickness is "$\frac{1}{4}\lambda$" wavelength:

$$T \approx \frac{\lambda_0}{4\sqrt{n_D^2 - n_S^2}}$$

The second contribution characterizing the invention requires a substantial index contrast as between the device functional layer and the surrounding medium. Expressed as the fraction $n_D/n_S$, structures of the invention require a contrast of at least 1.5 and preferably greater.

Contrast ratios greater than 1.5 further advance the inventive thrust depending upon effective confinement and are, therefore, preferred. Available materials, otherwise suitable for surround, permit such greater values for devices operating at typical III-V and II-VI wavelengths. For example use of silicon nitride may result in contrast of $\approx 1.65$. Other materials may result in a contrast of 2 or more —$SiO_2$ surround may result in contrast of 2.3. Of course, air, other gaseous environments, or vacuum may result in $n_D/n_S$ values in excess of 3 (e.g. $\approx 3.5$).

As suggested, most circumstances dictate a preference for the "$\frac{1}{4}\lambda$" thickness as defined above. There are, however, circumstances under which somewhat thinner layers may be tolerated or even preferred. Such thinner layers inherently exclude a thinness-dependent increasing fraction of photon flux—to result in increased amplitude of evanescent field outside the layer, and, consequently, in increased propensity for coupling. With regard to such layers to be fabricated into devices of larger spacing or with regard to such spaced devices as permitted within local circuit regions, guiding is, to first approximation, the same. To large extent, such further thinning appreciably beyond "$\frac{1}{4}\lambda$" is limited by demands placed on fabrication. As presently contemplated, dictated by practical considerations, layers thinner than $\approx \frac{1}{8}\lambda$ are not likely to be used. Such a "$\frac{1}{8}\lambda$" layer is, consistent with the above, defined in terms of:

$$T \approx \frac{\lambda_0}{8\sqrt{n_D^2 - n_S^2}}$$

Note—Above discussion relating to values of "T" is in terms of a fundamental thrust of the invention in accordance with which spacing is reduced while keeping coupling to a minimum. As in other integrated circuits, there are positions at which coupling is wanted—is wanted to effect e.g. connection. The same considerations may be involved in this desideratum. Reduced thickness for properly spaced devices, in resulting in excluded flux, may designedly increase such wanted coupling.

It is recognized that the above equations are not rigorously derived. For example, they depend upon "bulk" values of index—both as within the functional device layer and its surround. Such bulk values are not precisely descriptive of most forms of devices constructed in accordance with the invention—devices constructed of functional device layers in which thickness may be such as to have significant effect on refractive index (as to alter index due to interaction as between photon flux and surfaces/interfaces—as further aggravated by any deviation from perfect surface smoothness). Further design may, as noted, deliberately entail index inhomogeneities—e.g. as due to layer-to-layer variations within "superlayer structures", or as due to graded index. Use of weighted averages as provided for, while improving the approximation, does not, in itself, yield rigorously precise values.

Extensive study and experimentation satisfactorily support use of the equations presented for reliable translation of the inventive teaching into structures which share the advantages taught. Accordingly, while the "$\frac{1}{4}\lambda$" value of T is a convenient measure for purposes of design/fabrication, the value yielded by the equation is only approximately correct—the precise thickness value of T for the "optimum" layer may vary—within the $\approx \pm 10\%$ range. As indicated, criteria as so presented invariably result in advantages upon which the invention is based.

The same considerations—substantial energy confinement due to prescribed layer thickness—translates into useful device properties, particularly for devices of small lateral dimensions contemplated. Devices of least dimension less than 20 $\mu$m—likely smaller—operate effectively due to this quality. Contemplated minimum dimension as small as $\approx \frac{1}{2}\lambda_0$ share the energy efficiency fundamental to the inventive teaching to result in low needed input power. This is true of amplifying as well as other active devices, and of waveguides and other passive devices. An important consequence of lowered input power is lowered dissipation—to reduce e.g. unwanted heating. Studies establish feasibility of device operation at <100 microwatts dissipation/device averaged over such devices as included in a full functioning optical IC portion herein.

The invention is described in terms of most salient features—in terms of design flexibility and noted advantages as resulting from the highly efficient energy confinement afforded by thin full functional device layers discussed. Description with regard to composition is largely in terms of III-V and II-VI-based materials of present interest. The inventive teaching is advantageously applied to any such materials, but is not to be so restricted. Inventive requirements are in such terms as to be directly applicable to other materials—even to as—yet unidentified materials. Particularly with a view to inclusion of light generating devices, there has been some emphasis on semiconductor materials of direct bandgap. For many contemplated purposes, indirect bandgap materials may serve—for specific purposes perhaps advantageously. Variation in material properties, as yet unrealized, may permit use of the inventive approach—as an example, effort directed toward modification of silicon to permit still broader use, perhaps to convert its band structure or to introduce useful light-generating properties by doping, may be successful.

The Inventive Product

It is convenient to discuss concerned integrated optics in terms of the figures. Full functional optical IC portions characterized as above—in terms of, e.g. functional layer thickness, index/indices, device dimensions, device spacing—are here defined as including at least 100 optical elements (at least 100 optical devices) meeting the inventive criteria of thickness and index contrast. Full functional optical IC portions may include additional circuitry—may include elements which do not meet the inventive criteria. They may include e.g. optical elements of greater thickness (of thickness of one or many wavelengths as defined), as well as non-optical elements—e.g. electronic elements and/or conductors, some likely serving functions of support circuitry.

FIGS. 1-10 constitute a representative "catalog" of elements and subcircuits meeting the inventive criteria.

Figure 1:
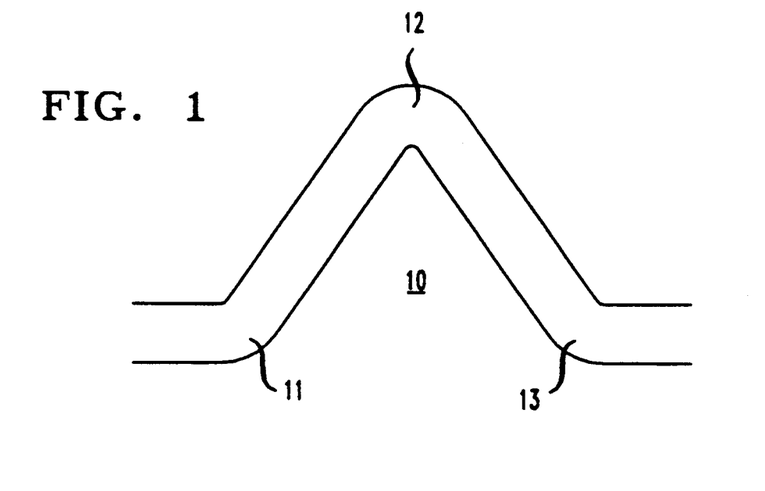
FIG. 1 is a plane view of an element serving purposes including signal transport. Whether passive or active it illustrates an advantage of the teaching in permitting a tight bend of small bend radius as due to the strong guiding power of the thin, highly index contrast layer from which it is fabricated.

FIG. 1 is illustrative of a category of elements—constituting passive or active devices—likely included in a full functioning optical IC portion. The particular element 10 provides for transport of photon flux and resembles a ridge waveguide. It may have relatively tight bends—e.g. $5\lambda_0$ or less for tolerable loss—as at 11, 12 and 13, as permitted due to the thin device functional layer of which relevant devices are constructed. For optimal thickness, for "quarter wavelength" thickness, a bend radius of $2\lambda_0$—e.g. 3 $\mu$m—results in a loss of less than 1% 90° bend (for flux wavelength of $\lambda_0 = 1.5$ $\mu$m). While likely serving as a simple passive transport element, it may serve additional functions as well. For example, optical pumping, by means not shown, may saturate the guide 10 to lessen insertion loss— e.g. to "bleach" a laser composition or other absorbing medium. Such optical pumping may be constant, or it may be altered in amplitude, either continuously or stepwise. In accordance with Definition of Terms, the element shown would then be classified as "active".

Figure 2:
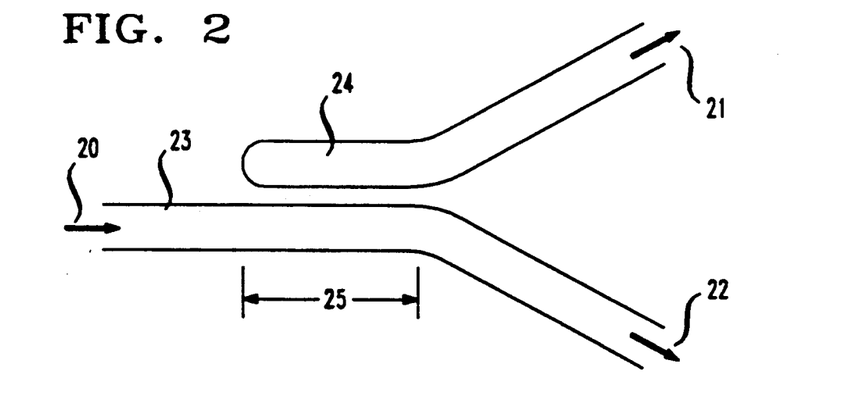
FIG. 2 depicts a passive element providing for splitting of an incoming signal to result in propagation in two guides.

FIG. 2 provides for splitting or "fan-out" as between incoming signal 20 and outgoing signals 21 and 22. The action is a consequence of coupling between guides 23 and 24. For contemplated materials and dimensions as discussed, a spacing of approximately $0.5\lambda_0$ for an interaction length 25 of $5\lambda_0$, results in approximately 45% of incident signal in each outgoing guide. The same flux division is obtained for closer spacing and shorter interaction length or for further spacing and longer interaction length.

As indicated here and elsewhere, permitted close device spacing is a significant consequence of the pronounced energy confinement associated with the thin device functional layer. Where needed, spacing and/or crosstalk may be further reduced by provision of a metal barrier between such devices. Cost of e.g. a metal film of elemental aluminum may be justified, at least in specific positions on the IC, under critical circumstances.

Figure 3:
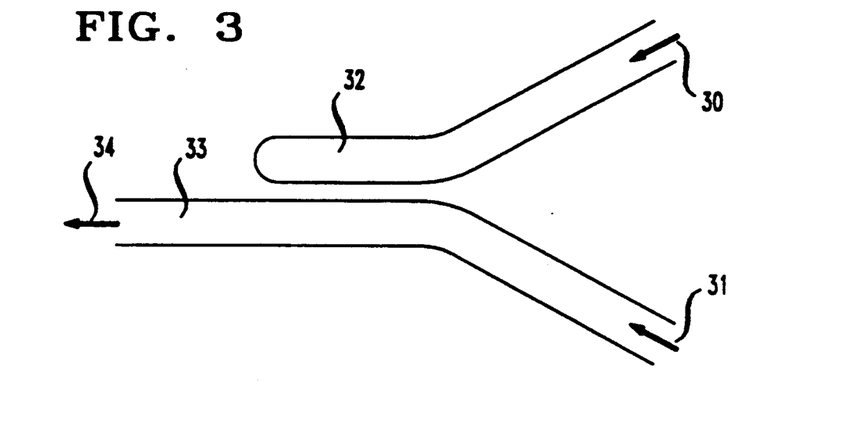
FIG. 3 depicts an element physically similar or even indentical to that of FIG. 2 but providing for combination of two incoming signal streams.

FIG. 3 depicts a passive element providing for merger of incoming signals 30 and 31 as introduced respectively into guides 32 and 33 to result in combined output signal 34. Coupling as to assure $\approx 45\%$ of the totality of the flux introduced into both of guides 32 and 33 is assured by spacing of $0.5\lambda_0$, assuming single mode operation. As in FIG. 2 description, the contemplated interaction distance of $\approx 5\lambda_0$ may be shortened or lengthened while retaining coupling strength by respectively reducing or increasing coupling spacing.

Figure 4:
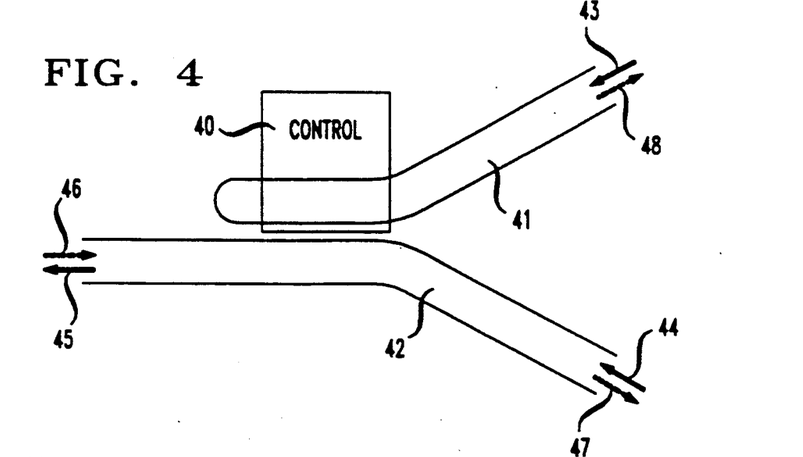
FIG. 4 is again a plane view of a structure resembling that of FIGS. 2 or 3, and providing for the splitting of the former or the combining of the latter, with additional provision of a control for switching or altering relative amplitudes during operation. The structure shown may, accordingly, be "active" in accordance with usage of that term in the present teaching.

The active device of FIG. 4 provides for control means shown schematically as 40. The control means provides for, e.g. electronic or photonic energization to modulate coupling as between guides 41 and 42. Performing as a combiner, incoming signals 43 and 44 are controllably merged to result in combined output signal 45. Performing as a splitter, incoming signal, shown as broken arrow 46, may result either in the entirety of the detectable signal exiting as 47 or, alternatively, in part of the flux exiting as signal 48.

Figure 5:
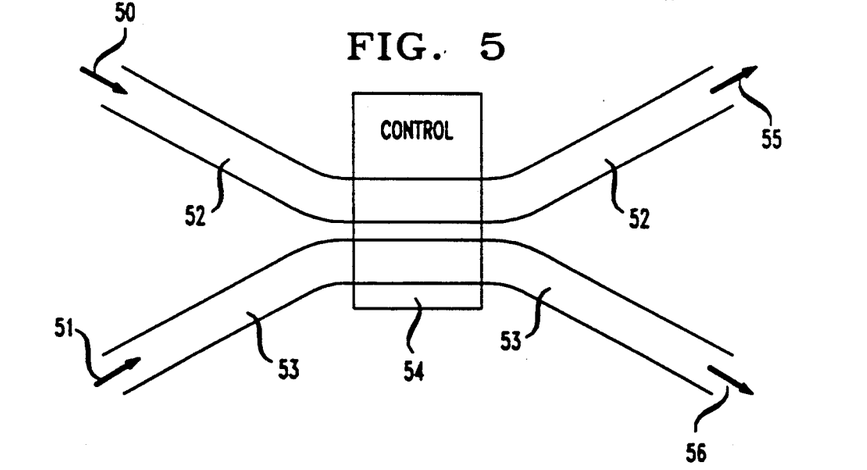
FIG. 5 is a plane view of a structure, either passive or active, providing for coupling or decoupling as between two adjacent lines.

FIG. 5 provides for coupling as between input signals 50 and 51 in guides 52 and 53. Control 54, again likely electronic or photonic, may permit or preclude coupling—may modulate amplitude resulting from coupling ultimately to switch—to result in output signals 55 and 56 of content/amplitude as so determined. Alternatively, physical omission of, or constancy of input to "control" 54 may convert the depicted structure so that it performs as a passive element. Performing as an active element, consistent with the "on-off" logic of prevalent modern electronics, control element 54 may selectively determine detected states in which effectively either: amplitude/content of $55=50$ and $56=51$ or; $55=50+51$ and 56 is cancelled.

The structure of FIG. 5 may serve as a two-by-two switch in which input as 50 or 51 may be made to exit at 55 or 56. Arrays of such switches may increase input/output lines so that, e.g. an $8 \times 8$ array may operate as a sixteen-by-sixteen switch structure. Arrays of this nature are illustrative of simple forms of the invention likely to find relatively near-term use. They may serve, for example, as interconnects, e.g. in lieu of the particular full functioning optical IC portion serving as interconnect for ICs 102 and 103 of FIG. 10.

Figure 6:
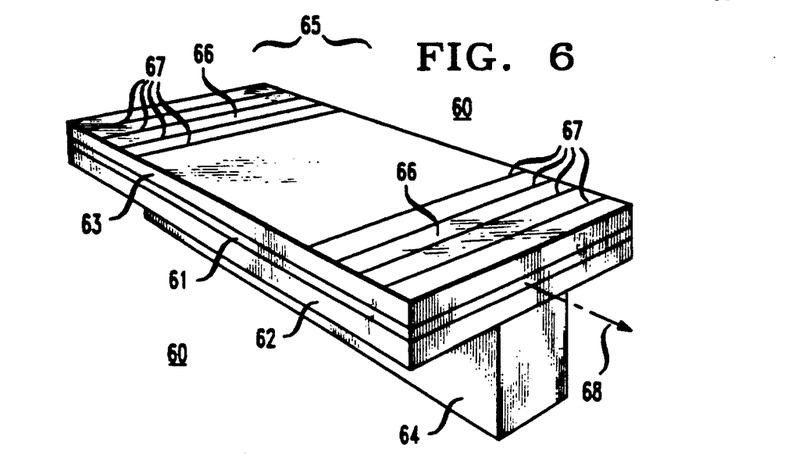
FIG. 6 is a perspective view depicting an illustrative embodiment of a photon flux generator. An included structure of particular significance is the thin film laser which, due to such thinness together with the index contrast common to other inventive embodiments, manifests the signal confinement to permit low threshold lasing with consequences, e.g. in terms of dimensions and/or low noise, operation as discussed in the Detailed Description.

FIG. 6 is illustrative of photon flux-generating devices suitably included in optical circuitry of the invention. The flux confinement characterizing devices fabricated from the thin device functional layer is of particular value in terms of such devices. Improved efficiency and/or fabrication simplification is of consequence in a large class of such devices including lasers, e.g. whispering mode structures as described in copending U.S. patent application Ser. No. 07/761,207 filed Sep. 17, 1991, as well as cavitating structure operating below threshold-structures sometimes referred to as superluminescent diodes. Improved guiding power constrains emission spreading from simple LED structures, and so improves their functioning as well.

FIG. 6 is intended as explicitly representative of a simple structure depending upon but a single standing wave—in contradistinction to the whispering mode structure. Both types of structures have characteristics—fabrication as well as performance—such that neither is precluded for IC use. Structure 60, while not so limited in operation, is discussed primarily in terms of a rectilinear lasing device for operation above lasing threshold. As depicted, it consists of active gain region 61, e.g. of suitable III-V composition sandwiched between layers 62 and 63, the three layers together constituting the "device-functional layer" common, as unmodified or modified, to most or all other devices—active and passive—within an optical IC portion.

While detailed discussion is not merited, practice of a preferred embodiment providing for fabrication of most, or even all, devices to be included in a full functioning optical IC, may usefully contemplate performance or fabrication where the device functional layer is to include flux-generating elements. Under classical conditions, use of laser-specified material in other elements operating below lasing threshold may result in intolerable loss for transmitting signals. One solution provides for altering the bandgap of non-lasing element material e.g. by diffusion. Another approach depends upon operating conditions to result in laser output at a wavelength which does not correspond with the full material bandgap. An example involves "bandgap shrinkage" to result in increased wavelength from laser elements. Another involves energization of non-laser material to alter its bandgap—examples include electronic biasing to shift quantum well state energies. Still another solution involves saturation or "bleaching" by direct current biasing.

Requisite index contrast—as between exposed surfaces of structure 60 with surrounding medium 65—as discussed—permits small layer thickness for given fractional $\lambda$ layers—e.g. for the maximum half wavelength or preferably quarter wavelength dimension of particular value for cavitation. Field confinement increase translates into decrease in laser threshold value.

While other fabrication approaches are satisfactory, the use of a pedestal 64 of reduced cross section as interfacing with structure 60, permits air or vacuum interface, to maximize index contrast at exposed surfaces of layers 62 and 63, in the manner of the whispering mode micro-resonators of the copending application. The strong guiding properties bring about relaxation in needed reflectivity for the Fabry-Perot structure (structure 60). For illustrative purposes, reflectivity is provided by distributed feedback regions 66, e.g. as constituted of grooves 67 positioned at usual Distributed Bragg Reflector spacing, e.g. half wavelength spacing. Design criteria for such structures are well known—see for example G. P. Agrawal and N. K. Dutta, *Long Wavelength Semiconductor Lasers*, Van Nostrand and Reinhold Company, NY, (1986). Sufficient reflectivity for laser action for IC dimensions contemplated may require/depend on metal coating, not shown, e.g. a coating of gold or aluminum on the outer surface of an intervening low index material, not shown, e.g. on $SiO_2$ with such coating encompassing a structure length of several wavelengths (thereby permitting 90+% reflectivity). The structure of FIG. 6 is intended as representative of elements operating below lasing threshold as well—a variety of circuit functions may be performed by use of superluminescent diodes with resulting saving in fabrication cost/yield. Flux-generating structures may be light pumped, e.g. by separate laser structures—as included on the same plane with or on a plane adjacent to that of signal circuitry, or, alternatively, may be based on electrical pumping by means not shown. Emission, e.g. as represented by arrow 68 may be in-plane, to permit expedient coupling in the manner of that of usual edge-emitting structures.

Figure 7:
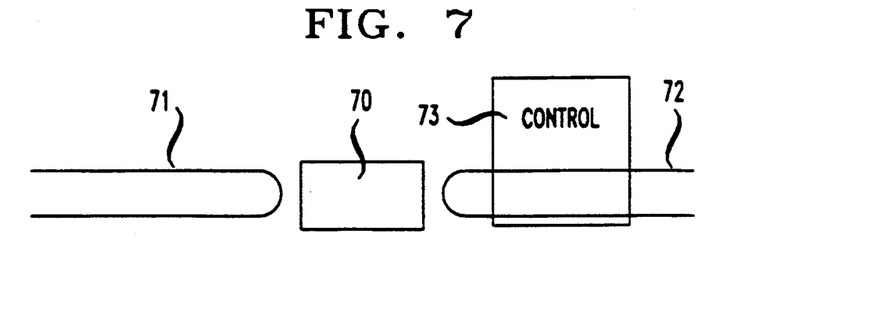
FIG. 7 is a plane view schematically depicting an IC region providing a laser such as that of FIG. 6 as combined with input/output lines and with control means for coupling/decoupling.

FIG. 7 is a schematic representation of a part of an optical IC portion of the invention. Shown are: flux generator 70, e.g. laser 60 of FIG. 6, sandwiched between guides 71 and 72. In the example shown, coupling strength as between guide 72 and flux generator 70 is controlled by control 73 which may e.g. permit modulation of coupling strength, or may decouple guide from generator in the absence of a control signal. The figure is representative of a large number of variations, providing for, e.g. change in flux flow direction, as well as equipment variations e.g. eliminating or increasing number of control elements.

Figure 8:
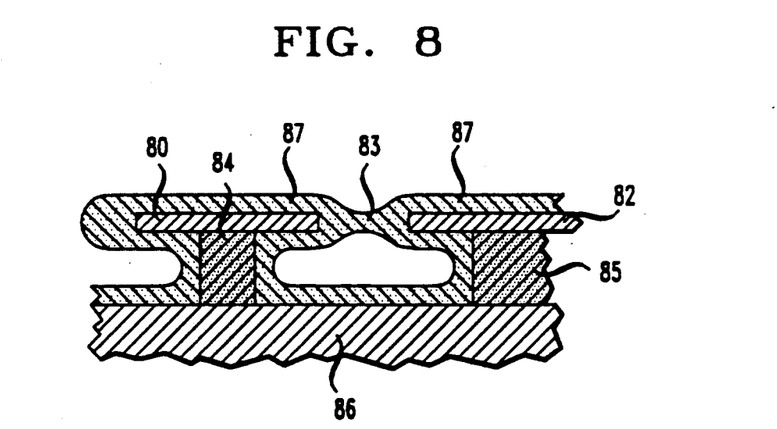

FIG. 8 is a sectional view, most importantly depicting an effective means for coupling elements 80 and 82 in separated region 83. In the structure shown, elements 80 and 82 were fabricated by etch-separation of a single device functional layer, to result in separation region 83, perhaps with separation of spacing of $\approx 2\lambda_0$, for the center wavelength of concerned photon flux. Bridging of region 83 by silica or other encapsulating material 87 is expeditiously accomplished by Chemical Vapor Deposition. Alternatively, assuming availability of material to suit specific objectives, such bridging may be the consequence of wetting of material of suitable free energy/viscosity properties—followed by solidification as by freezing or solvent removal. There is sufficient variety in suitable bridging processes as well as materials to impose little constraint on composition choice for pedestals 84 and 85, and for substrate 86.

Silica is an example of a class of materials of appropriate performance characteristics—e.g. transparency—as well as fabrication characteristics—e.g. low deposition temperature. The neck-down dimension may be of thickness comparable to the device-functional layer or may be otherwise to serve a particular need. Since the nature of this neck-down region, as CVD produced, is such that it necessarily varies in cross-section to attain a minimum at a position spaced from facing surfaces of guides 80 and 82, and since, in any event, it is relatively short in the flux traversal direction, size is relatively non-critical.

Use of thin functional device layers in accordance with the invention impacts wanted coupling efficiency. Required precision, particularly as to placement of elements on a common plane, is expedited by approaches such as that of FIG. 8. The bridge coupling illustrated takes advantage of common planarity of devices as fabricated from a common layer. Contemplated circuitry may, however, be best served by devices on differeing planes. The essence of evanescent field coupling does not require common planarity, but only requires sufficient proximity—a requirement generally satisfied in terms of spacing of $\approx \frac{1}{2}\lambda_0$. Plane-to-plane coupling may be accomplished due simply to such proximity, or may be expedited by properly positioned deposited material, e.g. $SiO_2$ to result in vertical bridging analogous to that shown.

Figure 9:
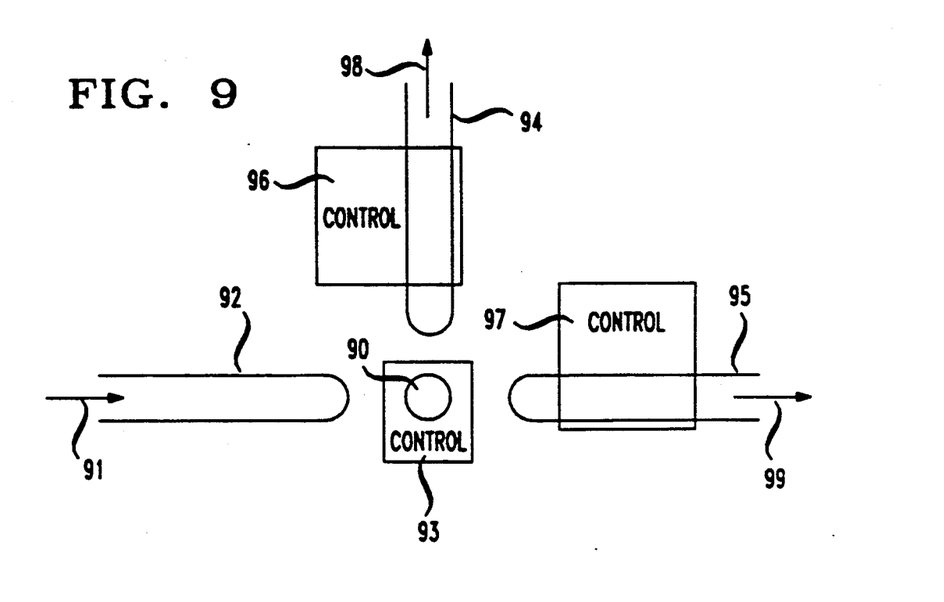
FIG. 9 schematically depicts a portion of an IC providing for selective coupling—as to either or both of amplitude and line choice—e.g., of signal emanating from a whispering mode resonator.

FIG. 9 is a schematic representation of an IC region, in turn, part of a full functioning optical IC, which may be implemented through the use of a whispering mode resonator, e.g. a disc resonator 90, generically described in copending application Ser. No. 07/761207, filed Sep. 17, 1991. For the example shown, an input signal 91 as introduced in transport element 92 (depicted as a passive element) is introduced into disc 90. Control 93 may perform coupling-decoupling function for such introduced flux or, alternatively, may control operation of resonator 90—e.g. to discontinue operation or vary amplitude. Resonator 90 may be pumped by electrical or optical means not shown. Introduction of emitted signal from resonator 90 may be into either or both of guides 94 and 95 as determined by controls 96 and 97 to, in turn, result in output signal at either or both of output positions 98 and 99.

Control elements in the structure of FIG. 9 as well as in other included IC portions may depend on any of various mechanisms, e.g.: quantum-confined Stark effect, saturable absorption, phase space filling, etc.

Figure 10:
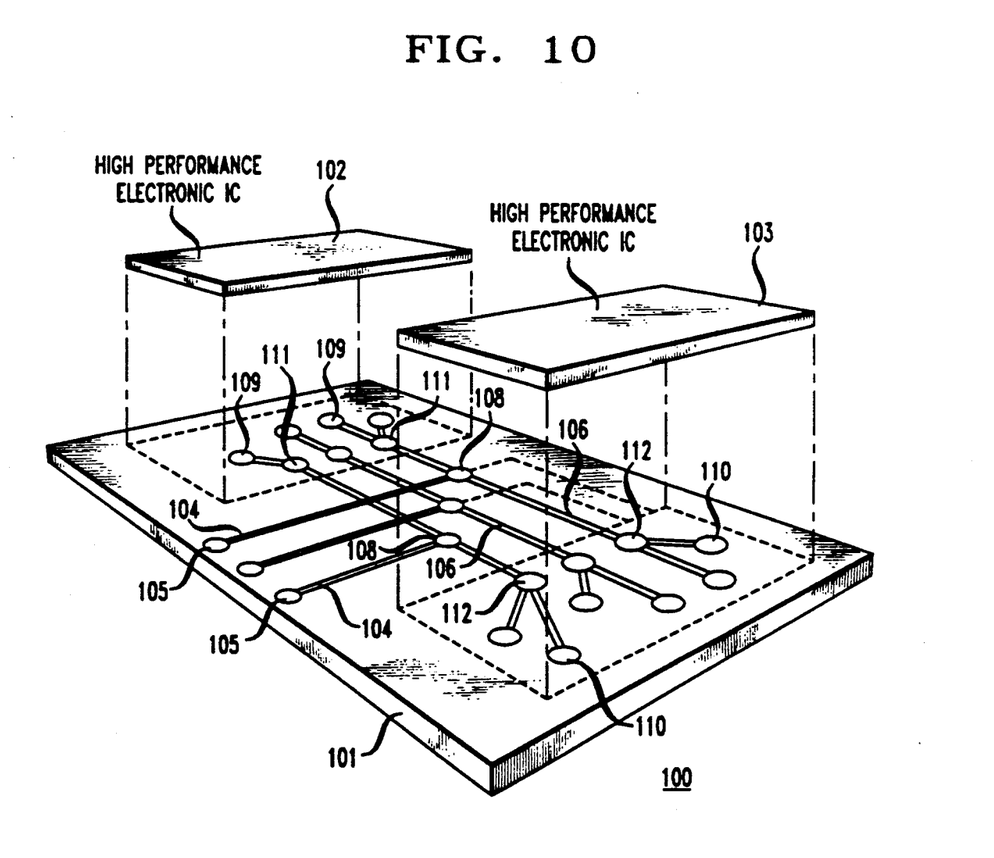
FIG. 10 is a perspective of a version of the invention in which the concerned optical IC portion serves as a "smart" interconnect between electronic ICs/portions.

The apparatus of FIG. 10 shown in perspective, and with parts separated for ease of description, is representative of a likely near-term use of the inventive teaching. While of more generic applicability, the relevant full functioning optical IC portion 100 as constructed on substrate 101, itself a part of device-functional layer in common with other full functioning optical IC portions of the invention, serves as a "smart" interconnect as between high-performance electronic integrated circuits 102 and 103. Details of the optical IC portion 100 are elsewhere discussed and are not shown here. Briefly, the depicted example provides for coupling of guides 104 to optical fibers not shown at coupling points 105. Selective coupling of input signals into guides 106 of optical bus 107 is controlled by optical switch logic by means not shown at junctures 108. Optical-to-electrical conversion, designed to interface with contacts not shown on the undersides of ICs 102 and 103, is made at elements 109 and 110. Fan-out, likely with path choice as determined by optical switch logic, is determined by operation of elements such as 111 and/or 112.

While wholesale substitution of photonic ICs for electronic ICs is not a near-term likelihood, advantages of the "smart interconnect" of FIG. 10 may suggest early use. Electronic interconnection of electronic ICs such as 102 and 103 of FIG. 10, while acceptable at clock rates of $\approx 1$ gbit/sec., are a problem at higher speed. Presently assumed need for resistor shunting—e.g. $\approx 50$ ohm—to avoid performance-limiting reflection becomes a problem at higher speed-certainly at $\approx 10$ gbit. Performance limitation is a consequence of capacitance-limiting loss for usual interconnect length in excess of $\approx$ millimeter order. Optical circuitry is not similarly limiting.

Fabrication

Various known fabrication techniques are suitable for construction of full functioning optical ICs and ancillary apparatus described. Operation at "optical" wavelengths imposes requirements e.g. in terms of surface/interface smoothness as well as compositional precision and uniformity, etc. The $\frac{1}{2}\lambda$ layer thickness maximum common to full functioning optical ICs of the teaching impose further constraints. Satisfaction of such requirements, depending on detailed considerations, requires precautions with regard to such characteristics as: crystallinity—e.g. with regard to surface presented for etching; freedom from voids in the instance of polycrystalline surface to be processed; and attention to temperature uniformity as well as uniformity of other processing-relevant conditions, etc.

Fortunately, epitaxial growth techniques, e.g. Metal Organic Chemical Vapor Deposition and Molecular Beam Epitaxy are sufficiently advanced to permit reliable growth of the several hundred Å thick and thicker layers thus far studied.

FIGS. 11a through 11f illustrate a typical processing sequence useful in the generation of a highly confined optical microstructure of the invention. The particular structure shown is suitable for operation at $\lambda_0 = 1.55$ $\mu$m. It involves MOCVD growth on an InP substrate 120 of: 200 Å InGaAsP layer 121; 100 Å InGaAs layer 122; 200 Å InGaAsP layer 123; and finally 200 Å InP layer 124.

Figure 11A:
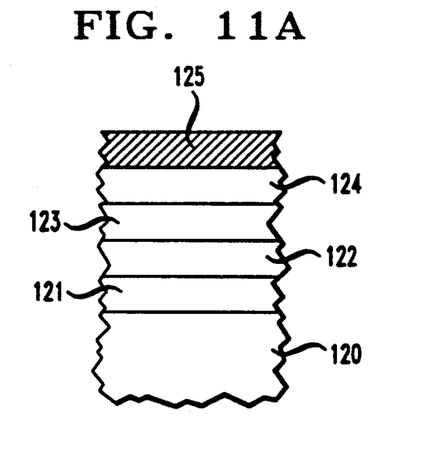
FIGS. 11a through 11f, depicts sequential process steps suitable for fabrication generation of structures of the invention.

In FIG. 11a, a 1200 Å thick $Si_3N_4$ layer 125 has been deposited by MOCVD.

Figure 11B:
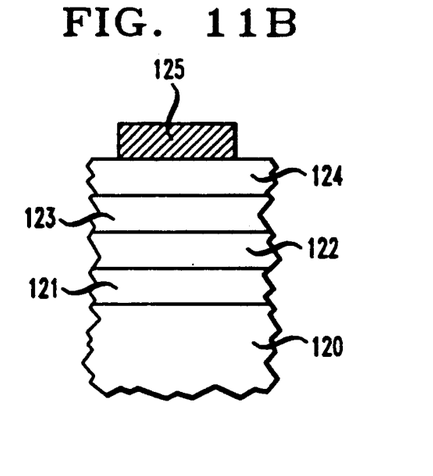

In FIG. 11b, layer 125 has been photolithographically patterned to yield masking region 126. Desired dimensions of the order of one or a few wavelengths (as measured in vacuum—$\lambda_0$) may depend upon short wavelength delineating radiation, e.g. accelerated electron radiation as described in copending U.S. patent application Ser. No. 07/498,179, filed Mar. 23, 1990 just allowed or ringfield scanning x-ray as described in U.S. patent application Ser. No. 07/732,559, filed Jul. 19, 1991.

Figure 11C:
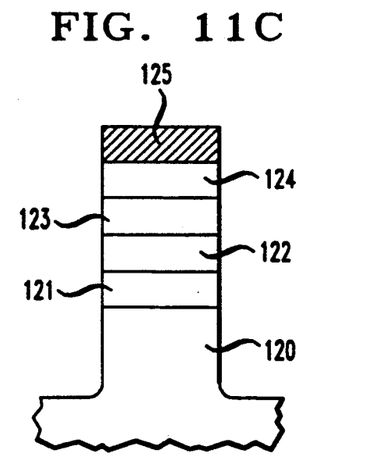

In FIG. 11c, the layered structure has been etched by Electron Cyclotron Resonance to the depth indicated thereby yielding the columnar body atop partially etch-defined InP.

Figure 11D:
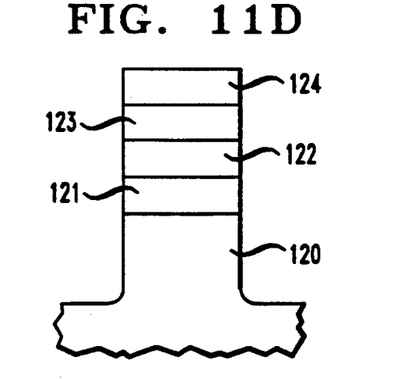

In FIG. 11d, the masking $Si_3N_4$ layer has been removed in $CF_4$ plasma.

Figure 11E:
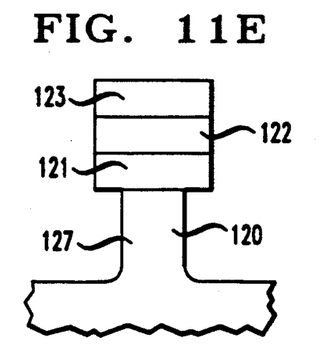

Selective chemical etching of InP—of region 120 using an aqueous HCL solution has yielded reduced cross-section column 127 as shown in FIG. 11e.

Figure 11F:
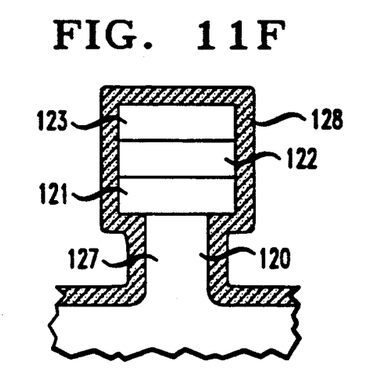

FIG. 11f depicts a final element as encapsulated in layer 128 of a 0.5 $\mu$m thick layer of Chemical Vapor Deposition-grown $SiO_2$. This figure is illustrative of a general approach designed to lessen free surface carrier recombination. Layer 128 serves as an example of what is sometimes referred to as a "regrowth" layer—a layer of epitaxially grown material of increased bandgap relative to the free surface on which grown. Good quality epitaxial growth serves to effectively avoid recombination on defects or other recombination centers. Increasing bandgap in such regrowth layer prevents penetration of carriers to result in similar recombination problem on the new free surface presented. $SiO_2$, in presenting a larger bandgap than illustrative materials of layers 121-123, if of sufficient epitaxial quality, e.g. to minimize likelihood of voids, may serve. Good epitaxial growth, assuming needed crystallinity match, is advanced by clean substrate surface—assured by etch-cleaning.

We claim:

1. Apparatus comprising an integrated circuit chip portion which is designed to operate by use of photons within the wavelength range of from 0.3 $\mu$m to 10.0 $\mu$m as measured in vacuum, said portion comprising a full functioning optical integrated circuit including a substrate supporting photonic devices including "active" devices, for modifying some property of such photons temporally in response to modifying energy and "passive" devices comprising devices serving as transmission paths for such photons, at least some of said paths being optically connected with active devices, in that said full functioning optical circuit performs at least three photon-governing functions, selected from the group consisting of transport, redirection, combination, splitting, modulation, and amplification, the said integrated circuit being provided with output means for coupling photonic energy from said portion, characterized in that: at least 50% of said active and passive devices are of a functional layer thickness as measured orthogonal to a plane of transmission path direction, of mathematical value in accordance with the equation, $$T \leq \frac{\lambda_0}{2\sqrt{n_D^2 - n_S^2}}$$

in which:

T = functional layer thickness
$\lambda_0$ = wavelength as measured in vacuum
$n_D$ = the average value of bulk refractive index for the functional layer
$n_S$ = the effective average value of bulk refractive index for the surrounding material about the said devices; and in that the index contrast, defined as the numerical value of the fraction, $n_D/n_S$, is at least equal to 1.5, thereby permitting small attained spacing values, between devices consistent with minimum permitted unwanted signal coupling.

2. Apparatus of claim 1 in which said full functioning optical integrated circuit includes a total of at least 100 active and passive devices of said thickness T and of said index contrast.

3. Apparatus of claim 2 in which substantially all of the said active devices are optically connected at least once with passive devices of said thickness, T, and of said index contrast, $n_D/n_S$.

4. Apparatus of claim 3 in which said passive devices of thickness, T, and index contrast $n_D/n_S$ consist of transmission paths.

5. Apparatus of claim 1 in which minimum attained spacing between devices is $\leq 10\lambda_0$.

6. Apparatus of claim 5 in which substantially all adjacent, parallel unconnected transmission paths in said full functioning optical integrated circuit are separated at said attained spacing over a substantial portion of their length within such parallel regions.

7. Apparatus of claim 1 in which the mathematical value of T is within the range of from $$\frac{\lambda_0}{8\sqrt{n_D^2 - n_S^2}} \text{ to } \frac{3\lambda_0}{8\sqrt{n_D^2 - n_S^2}}$$

8. Apparatus of claim 1 in which the said index contrast, $n_D/n_S$ is at least equal to 1.7.

9. Apparatus of claim 1 in which the said index contrast, $n_D/n_S$ is at least equal to 2.0.

10. Apparatus of claim 1 in which the said index contrast, $n_D/n_S$ is at least equal to 3.0.

11. Apparatus of claim 1 in which said portion includes additional circuitry in addition to said full functioning integrated circuit.

12. Apparatus of claim 11 in which said additional circuitry includes devices differing from said at least 50%.

13. Apparatus of claim 12 in which said additional circuitry includes devices of functional layer thickness greater than the said mathematical value of T.

14. Apparatus of claim 12 in which said additional circuitry includes electronic devices.

15. Apparatus of claim 14 in which said additional circuitry consists essentially of a support circuit for said full functioning optical integrated circuit.

16. Apparatus of claim 15 in which said support circuit electrically biases at least one device included in said full functioning optical integrated circuit.

17. Apparatus of claim 16 in which electrical biasing alters refractive index, $n_D$, of the biased device.

18. Apparatus of claim 17 in which the biased device is active and in which there is provision for temporally altering biasing conditions during operation.

19. Apparatus of claim 14 in which the said full functioning optical integrated circuit includes a light-generating device and in which the said additional circuitry energizes such light-generating device.

20. Apparatus of claim 19 in which the said light-generating device is a laser and in which energizing is sufficient to put the laser above lasing threshold.

21. Apparatus of claim 1 in which said full functioning optical integrated circuit connects with at least one electronic integrated circuit.

22. Apparatus of claim 21 in which said full functioning optical integrated circuit interconnects at least two electronic integrated circuits.

* * * * *